US011991820B2

(12) United States Patent
Cueto et al.

(10) Patent No.: US 11,991,820 B2
(45) Date of Patent: May 21, 2024

(54) APPARATUS WITH AIRFLOW CHAMBER

(71) Applicant: Comcast Cable Communications, LLC, Philadelphia, PA (US)

(72) Inventors: Osman Cueto, Lansdale, PA (US); David Luksenberg, Penn Valley, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

(21) Appl. No.: 17/127,133

(22) Filed: Dec. 18, 2020

(65) Prior Publication Data
US 2022/0201848 A1   Jun. 23, 2022

(51) Int. Cl.
*H05K 1/02* (2006.01)
*H05K 1/18* (2006.01)

(52) U.S. Cl.
CPC .......... *H05K 1/0272* (2013.01); *H05K 1/181* (2013.01); *H05K 2201/064* (2013.01); *H05K 2201/09063* (2013.01); *H05K 2201/10151* (2013.01)

(58) Field of Classification Search
CPC .................................... H01K 1/0272
USPC ........................................... 174/252
See application file for complete search history.

(56) References Cited

U.S. PATENT DOCUMENTS

| 4,415,780 | A | 11/1983 | Daugherty | |
|---|---|---|---|---|
| 6,543,282 | B1* | 4/2003 | Thompson | G01F 1/6842 |
| | | | | 73/204.15 |
| 2002/0139649 | A1* | 10/2002 | Miyake | H02B 1/048 |
| | | | | 200/296 |
| 2003/0038021 | A1* | 2/2003 | Tsutsui | H01H 13/06 |
| | | | | 200/517 |
| 2009/0326355 | A1* | 12/2009 | Brenneman | A61B 5/150213 |
| | | | | 600/347 |
| 2010/0128754 | A1* | 5/2010 | Jetter | G01N 27/3274 |
| | | | | 374/110 |
| 2010/0213044 | A1* | 8/2010 | Strittmatter | H01H 13/82 |
| | | | | 200/515 |
| 2016/0161298 | A1* | 6/2016 | Heffernan | G01N 33/0073 |
| | | | | 374/142 |

FOREIGN PATENT DOCUMENTS

EP    0571115    * 10/1993

* cited by examiner

*Primary Examiner* — Stanley Tso
(74) *Attorney, Agent, or Firm* — Ballard Spahr LLP

(57) ABSTRACT

An apparatus, such as a sensor device, may include a housing. The housing may include a top wall, bottom wall, and one or more side walls that define a cavity. A circuit board may be positioned within the housing. One or more chamber side walls may surround a portion of the circuit board and define a chamber within the cavity of the housing. A pathway may be provided that defines a fluid communication channel between the portion of the circuit board and an exterior of the housing. For example, a portion of the pathway may be provided along a perimeter of or through an activation member, such as a push-button or switch positioned along an exterior of the housing.

20 Claims, 10 Drawing Sheets

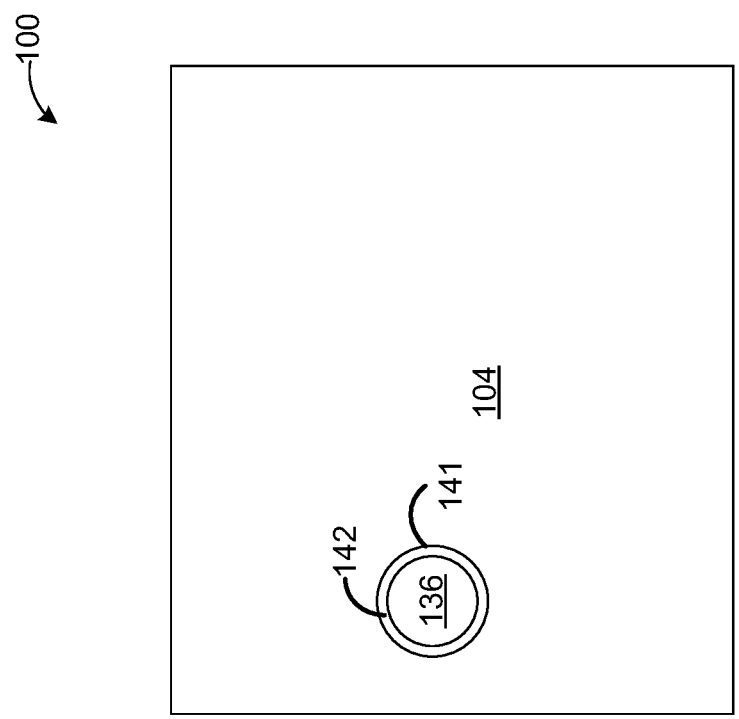

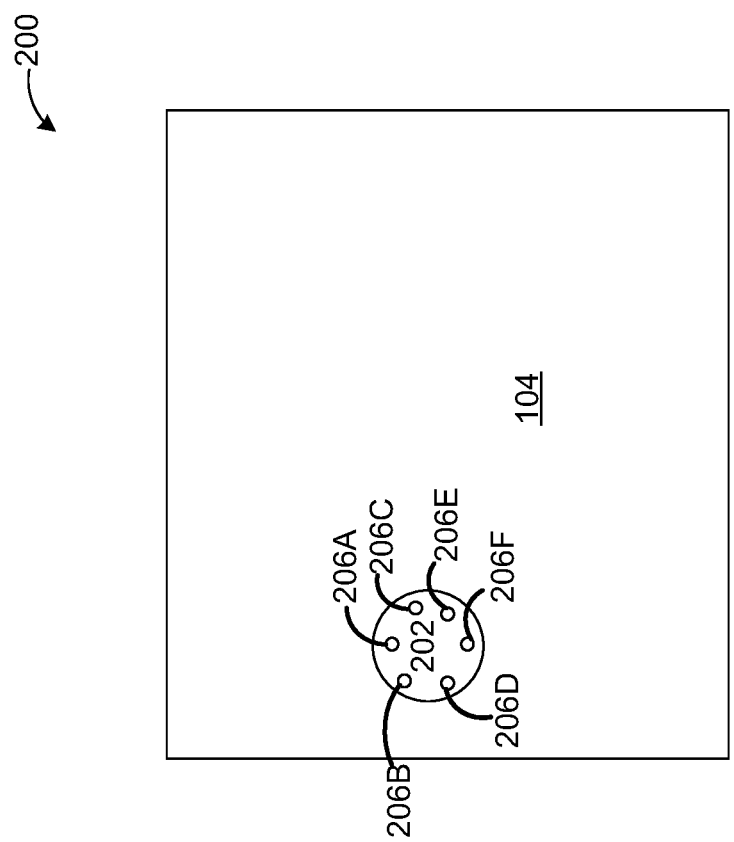

APPARATUS WITH AIRFLOW CHAMBER

BACKGROUND

Certain devices are designed with sensors to detect certain environmental conditions. Those conditions can include temperature, humidity, light level, motion, occupancy, vibration, etc. In order to protect the sensors, conventional devices position the sensors within a device housing. However, placing the sensors within the device housing can limit the sensors ability to sense ambient conditions outside of the housing or can provide incorrect data regarding the ambient conditions outside of the housing. Conventional devices have attempted to provide the sensors with better access to the ambient conditions by addition multiple openings in the housing. While the multiple openings can provide some access to ambient conditions, the access is limited and can require a significant amount of time for the ambient conditions to filter through the entire housing. Also, the multiple openings can make the housing and its components more susceptible to moisture intrusion.

SUMMARY

It is to be understood that both the following general description and the following detailed description are exemplary and explanatory only and are not restrictive. A device for sensing environmental conditions is described. The apparatus may include a housing. The housing may include one or more walls. For example, the housing may include a top wall, a bottom wall, and one or more side walls that together define a cavity within the housing. A circuit board may be positioned within the housing and enclosed within the walls of the housing.

An activation switch and one or more sensors may be operably coupled to the circuit board. For example, at least one of the sensors may be an environmental sensor configured to detect, at the sensing device, an environmental condition, such as temperature, humidity, occupancy, barometric pressure, magnetic flux, light-level, vibration, or another environmental condition. One or more chamber walls may extend between the circuit board and the inner surface of the housing to surround the activation switch and the one or more sensors and define a chamber within the cavity of the housing that seals off a portion of the circuit board from another portion of the circuit board within the cavity. The one or more chamber walls may only enclose or seal off a small portion of the circuit board and cavity of the housing.

An activation member, such as a button or rotatory switch may be operably coupled to the housing and/or the circuit board and may extend through an opening in one of the walls of the housing and into the chamber within the housing. An air flow pathway, such as an air gap or one or more apertures, may be provided between an outer edge of the activation member and an opening in one of the walls of the housing or through a head member of the activation member to provide an air flow pathway from an exterior of the housing to the one or more sensors in the chamber.

This summary is not intended to identify critical or essential features of the disclosure, but merely to summarize certain features and variations thereof. Other details and features will be described in the sections that follow.

BRIEF DESCRIPTION OF THE DRAWINGS

The accompanying drawings, which are incorporated in and constitute a part of the present description serve to explain the principles of the apparatuses and systems described herein:

FIG. 1D shows a top plan view of the example sensing device;

FIG. 2D shows a top plan view of the other example sensing device; and

DETAILED DESCRIPTION

Figure 1A:
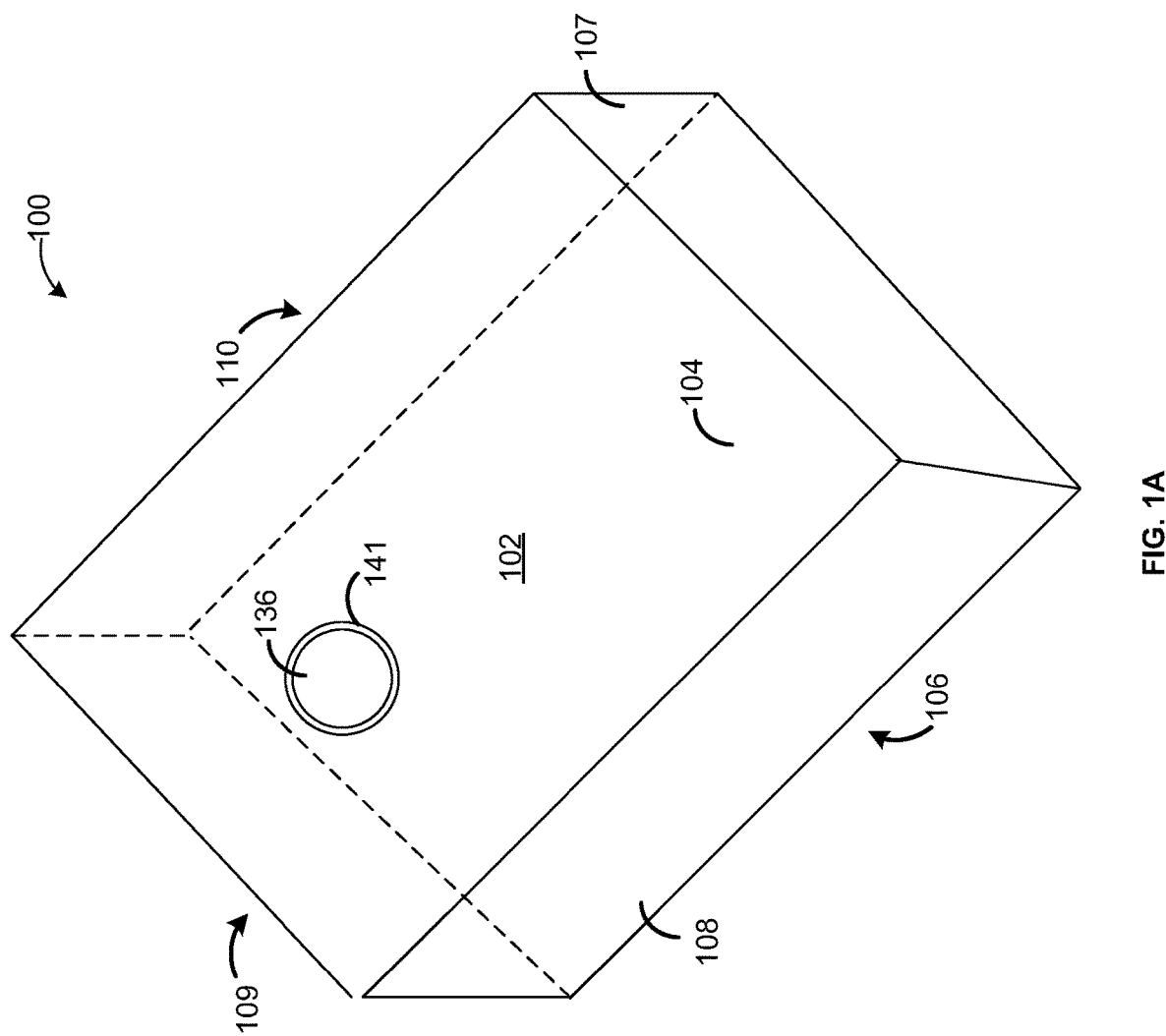
FIG. 1A shows a perspective view of an example sensing device.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another configuration includes from the one particular value and/or to the other particular value. When values are expressed as approximations, by use of the antecedent "about," it will be understood that the particular value forms another configuration. It will be further understood that the endpoints of each of the ranges are significant both in relation to the other endpoint, and independently of the other endpoint.

"Optional" or "optionally" means that the subsequently described element, feature, event, or circumstance may or may not be included or occur, and that the description includes cases where said element, feature, event, or circumstance is included or occurs and cases where it is not included or does not occur.

Throughout the description and claims of this specification, the word "comprise" and variations of the word, such as "comprising" and "comprises," means "including but not limited to," and is not intended to exclude other components, integers or steps. "Exemplary" means "an example of" and is not intended to convey an indication of a preferred or ideal configuration. "Such as" is not used in a restrictive sense, but for explanatory purposes.

Certain relationships between dimensions of the sensor device described herein and between features of the sensor device are described herein using the term "substantially." As used herein, the terms "substantially" and "substantially equal" indicates that the equal relationship is not a strict relationship and does not exclude functionally similar variations therefrom. Unless context or the description indicates otherwise, the use of the term "substantially" or "substantially equal" in connection with two or more described dimensions or positions indicates that the equal relationship between the dimensions or positions includes variations that, using mathematical and industrial principles accepted in the art (e.g., rounding, measurement or other systematic errors, manufacturing tolerances, etc.), would not vary the least significant digit of the dimensions. As used herein, the term "substantially constant" indicates that the constant relationship is not a strict relationship and does not exclude functionally similar variations therefrom. As used herein, the term "substantially vertical" indicates that the vertical relationship of the element is not a strict limitation and does not exclude functionally similar variations therefrom. As used herein, the term "substantially horizontal" indicates that the horizontal relationship of the element is not a strict limitation and does not exclude functionally similar variations therefrom. As used herein, the term "substantially parallel" indicates that the parallel relationship is not a strict relationship and does not exclude functionally similar variations therefrom. As used herein the term "substantially level" indicates that the positional relationship is not a strict relationship and does not exclude functionally similar variations therefrom.

It is understood that when combinations, subsets, interactions, groups, etc. of components are described that, while specific reference of each various individual and collective combinations and permutations of these may not be explicitly described, each is specifically contemplated and described herein. This applies to all parts of this application including, but not limited to, elements and features in described apparatuses and steps in described methods. Thus, if there are a variety of additional steps that may be performed or elements and features that may be included or substituted, it is understood that each of these additional steps may be performed or elements and features may be included or substituted with any specific configuration or combination of configurations of the described methods and apparatuses.

Throughout this application reference is made to block diagrams. It will be understood that each block of the block diagrams, and combinations of blocks in the block diagrams, respectively, may be implemented in a number of different ways. Accordingly, blocks of the block diagrams support one or a combinations of devices for performing the specified functions.

Certain devices include one or more sensors positioned within their housings to detect one or more environmental conditions. In order for the one or more sensors to achieve the most accurate readings of environmental conditions outside of the housing, such as temperature, humidity, or other environmental conditions, the housings of the devices need to have a sufficient level of ventilation. By creating a chamber within the housing that includes the one or more sensors and that is smaller than the overall volume of the cavity of the housing and by sealing that chamber off from the remaining part of the housing, a smaller space is created that requires less ventilation and will more quickly reach an equilibrium with the ambient environmental conditions outside of the housing. Instead of creating additional openings along the housing of the device, which could potentially affect the IP rating of the device, an air gap or other air flow path may be provided along a perimeter of or through a button or switch mechanism positioned along the exterior of the housing of the device to provide an airflow path into the chamber where the one or more sensors are located.

Accordingly, a device for sensing environmental conditions is shown and described. The sensing device may include a housing that includes one or more walls. For example, the housing may include a top wall, a bottom wall, and one or more side walls that together define a cavity within the housing. A circuit board may be positioned within the cavity and enclosed within the walls of the housing.

An activation switch and one or more sensors may be operably coupled to the circuit board. For example, at least one of the sensors may be an environmental sensor configured to detect an environmental condition, such as temperature, humidity, occupancy, barometric pressure, magnetic flux, light-level, vibration, or another environmental condition. One or more chamber walls may extend between the circuit board and the inner surface of the housing to surround the activation switch, the one or more sensors, and a portion of the circuit board to define a chamber within the cavity of the housing that seals off the portion of the circuit board from another portion of the circuit board. The one or more chamber walls may have a first end that abuts, is coupled to, or is integrally formed with one of the walls of the housing and a distal second end that abuts the circuit board. The chamber may be sealed off from the remainder of the housing cavity. For example, the portion of the circuit board may be sealed off from the another portion of the circuit board by the one or more chamber walls. For example, one or both of the first end and the second end of each of the one or more chamber side walls may include a non-conductive, flexible material, such as silicone. The one or more chamber walls may only enclose a small portion of the circuit board and cavity of the housing.

An activation member, such as a button or rotatory switch may be operably coupled to the housing and/or the circuit board and may extend through an opening in the housing and into the chamber within the housing. An air flow pathway, such as an air gap or one or more apertures, may be provided between an outer edge of the activation member and an opening in the housing or through the activation member to provide an air flow pathway that defines a fluid communication channel from an exterior of the housing to the chamber, the portion of the circuit board, and/or the one or more sensors in the chamber.

FIGS. 1A-E show various views of an example sensing device 100 that may be configured to sense environmental condition data, such as temperature data, humidity data, occupancy data, barometric pressure data, magnetic flux data, light-level data, vibration data, etc., and send that data to a user device and/or a computing device. The sensing device 100 may be one or more of a temperature sensor, a humidity sensor, an occupancy sensor, a photosensor, a barometric pressure sensor, a magnetic flux sensor, a vibration sensor, or any other type of sensor. The sensing device 100 may be configured to be mounted, either fixedly or removably, to a portion of a building, such as a wall, ceiling, or floor, either directly or indirectly with the use of additional components.

The sensing device 100 may include a housing 102. The housing 102 may be constructed of one or more pieces. For example multiple pieces of the housing 102 may be coupled together using coupling devices, such as screws, nails, rivets, adhesive, pins and apertures, or the like. The housing 102 may be made of metal, plastic, wood, or any combination thereof. The housing 102 may have any 3-dimensional shape. For example, the housing 102 may be generally shaped as any one or more of a rectangular cuboid, cube, sphere, cylinder, triangular prism, or the like.

The housing 102 may include one or more walls depending on the shape of the housing 102 and the desired function of the device 100. For example, the housing 102 may include a top wall 104. The top wall 104 may include an outer facing surface and an inner facing surface. The top wall 104 may have any shape and surface. For example, the shape of the top wall 104 may be rectangular, oval, circular, triangular or any other geometric or non-geometric shape. For example, the outer surface of the top wall 104 may be planar, curved, and/or may include surface texturing.

The housing 102 may also include a bottom wall 106. The bottom wall 106 may include an outer facing surface and an inner facing surface. The bottom wall 106 may have any shape and surface. For example, the shape of the bottom wall 106 may be rectangular, oval, circular, triangular or any other geometric or non-geometric shape. For example, the outer surface of the bottom wall 106 may be planar, curved, and/or may include surface texturing.

The housing 102 may also include one or more side walls. The one or more side walls may extend from the bottom wall 106 to the top wall 104 or from the bottom 106 or top 104 wall to an intermediate wall. For example, the housing 102 may include a first side wall 107 that may have a first end coupled to the bottom wall 106 and a distal second end coupled to the top wall 104. The first side wall 107 may be positioned along a first side of the housing 102. The first side wall 107 may have any shape and surface. For example, the shape of the first side wall 107 may be rectangular, oval, circular, triangular or any other geometric or non-geometric shape. For example, the outer surface of the first side wall 107 may be planar, curved, and/or may include surface texturing.

The housing 102 may include a second side wall 108 that may have a first end coupled to the bottom wall 106 and a distal second end coupled to the top wall 104. The second side wall 108 may be positioned along a second side of the housing 102. The second side wall 108 may have any shape and surface. For example, the shape of the second side wall 108 may be rectangular, oval, circular, triangular or any other geometric or non-geometric shape. For example, the outer surface of the second side wall 108 may be planar, curved, and/or may include surface texturing.

The housing 102 may include a third side wall 109 that may have a first end coupled to the bottom wall 106 and a distal second end coupled to the top wall 104. The third side wall 109 may be positioned along a third side of the housing 102. The third side wall 109 may have any shape and surface. For example, the shape of the third side wall 109 may be rectangular, oval, circular, triangular or any other geometric or non-geometric shape. For example, the outer surface of the third side wall 109 may be planar, curved, and/or may include surface texturing. The housing 102 may include a fourth side wall 110 that may have a first end coupled to the bottom wall 106 and a distal second end coupled to the top wall 104. The fourth side wall 110 may be positioned along a fourth side of the housing 102. The fourth side wall 110 may have any shape and surface. For example, the shape of the fourth side wall 110 may be rectangular, oval, circular, triangular or any other geometric or non-geometric shape. For example, the outer surface of the fourth side wall 110 may be planar, curved, and/or may include surface texturing.

The first side wall 107 may extend from the fourth side wall 110 to the second side wall 108. The second side wall 108 may extend from the first side wall 107 to the third side wall 109. The third side wall 109 may extend from the second side wall 108 to the fourth side wall 110. The fourth side wall 110 may extend from the third side wall 109 to the first side wall 107. The one or more top walls 104, bottom walls 106 and side walls 107-110 may define a cavity 112 within the housing 102. The cavity 112 may be an open space within the housing 102 that is configured to receive one or more components of the sensing device 100.

The sensing device 100 may also include an activation member 136. The activation member 136 may be a manually adjustable device for turning on, turning off, or changing an operational status of the sensing device 100. For example, a user may apply a force to the activation member 136 to cause the sensing device 100 to be turned on, turn off, or to change an operational status of the sensing device 100. The activation member 136 may be any one or more of a push-button switch, a rotary switch, a rocker switch, a slide switch, a toggle switch, a hall-effect sensor or reed switch with a magnet (not shown) on the opposing end of the shaft 140, or any other type of switch known to those of ordinary skill in the art. For example, the activation member 136 may be a push-button switch.

The activation member 136, as a push-button switch, may include a head member 138 and a shaft 140 that has a first end coupled to the head member 138 and a distal free end that extends from one side of the head member 138. The activation member 136 may be movable along the longitudinal axis Y with respect to the housing. The activation member 136 may also include a biasing member (not shown), such as a spring, that biases the activation member 136 in the direction A. The activation member 136 may be operably coupled to the housing 102, the mounting platform 114 and/or the circuit board 124.

The activation member 136 may extend through an aperture in one of the walls 104-110 of the housing 102 and into the cavity 112 of the housing 102. For example, the top wall 104, bottom wall 106, first side wall 107, second side wall 108, third side wall 109, or fourth side wall 110 may include a switch aperture 141. For example, the top wall may include the switch aperture 141. The switch aperture 141 may have any shape, such as round, rectangular, triangular, oval, or any other geometric and non-geometric shape. The switch aperture 141 may have a perimeter having a perimeter distance that defines the opening through the top wall 104. The head member 138 of the activation member 136 may have any shape, such as round, rectangular, triangular, oval, or any other geometric or non-geometric shape. For example, the head member 138 can have a shape that corresponds with the shape of the switch aperture 141. For example, both the switch aperture 141 and the head member 138 may be circular, may be rectangular, may be triangular, may be oval, or may be any other corresponding shape.

The head member 138 may have an outer perimeter with a perimeter distance that is less than the perimeter distance of the switch aperture 141. For example, the head member 138 may be capable of being inserted into and through the switch aperture 141. In an example, in a resting position, the top surface of the head member 138 may be level or about level with the outer surface of the top wall 104. In an example, in a resting position, the top surface of the head member 138 may extend above or be recessed below the outer surface of the top wall 104. A space may be defined between the outer perimeter of the head member 138 and the perimeter of the switch aperture 141 due to the different perimeter distances and corresponding or substantially corresponding shapes of the head member 138 and the switch aperture 141. For example, an air gap 142 may be defined between the outer perimeter of the head member 138 and the perimeter of the switch aperture.

Figure 1B:
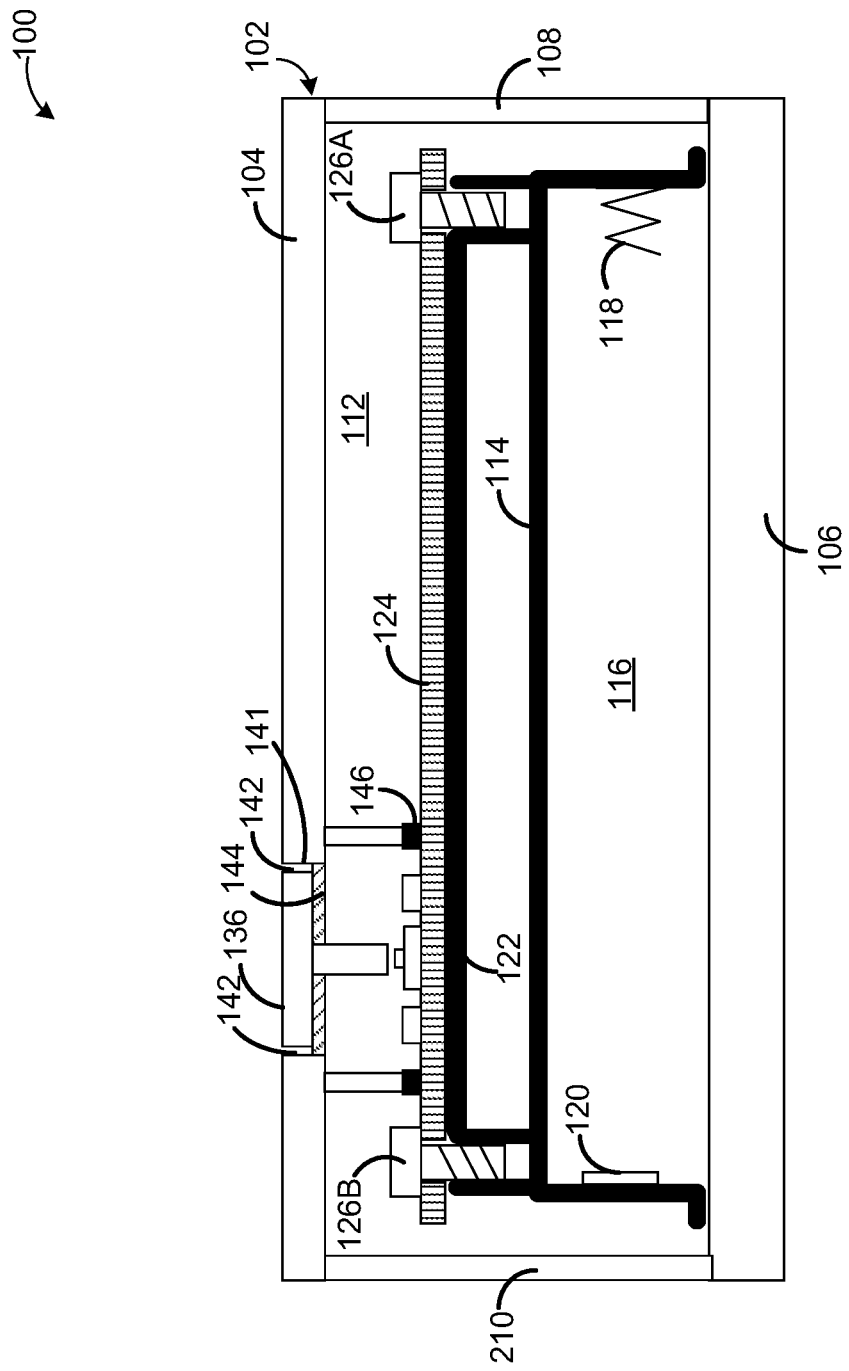
FIG. 1B shows a cross-sectional view of the example sensing device.

As best shown in FIG. 1B, the sensing device 100 may include a mounting platform 114. For example, the mounting platform 114 may be a battery tray. The mounting platform may be positioned within the cavity 112 of the housing 102. For example, the mounting platform 114 may be coupled to one or more of the walls 104-110 of the housing 102 via one or more coupling devices, such as screws, rivets, pins, nails, adhesive, or the like. The mounting platform 114 may include one or more vertical or substantially vertical side walls and one or more horizontal or substantially horizontal mounting walls for receiving one or more components. For example, the mounting platform may include one or more side walls and at least one mounting wall that may define a battery cavity 116. The battery cavity 116 may be sized and shaped to receive and removably couple a battery (not shown) to the mounting platform 114. For example, the battery cavity 116 may include a battery contact 118 along a first end of the battery cavity 116 and a battery contact 120 along a distal second end of the battery cavity 116. For example, the battery contact 118 may be a spring contact and the battery contact 120 may be a tab contact. In other examples, the spring contact and the tab contact may be reversed. The battery contact 118 may be configured to abut a first end of a battery and the battery contact 120 may be configured to abut a distal second end of a battery. The battery may be configured to provide electrical power to a circuit board 124 positioned within the cavity 112 of the housing 102. For example, the battery may be removably inserted into the battery cavity 116 and be electrically coupled to the circuit board 124 via the contacts 118, 120 or the battery may be hard wired and/or soldered to and electrically coupled to the circuit board 124 to provide electrical power to the circuit board 124. The battery can be any type of battery, such as an alkaline battery, a lithium ion battery, a nickel cadmium battery, a button cell battery, or the like.

The sensing device 100 may include a circuit board 124. The circuit board 124 may be positioned within the cavity 112 of the housing 102. The circuit board 124 may be coupled to the mounting platform 114 or the housing 102. For example, the circuit board 124 may be coupled to a mounting surface 122 of the mounting platform 114. For example, one or more coupling devices 126A-B may be used to couple the circuit board 124 to the mounting surface 122. The one or more coupling devices 126A-B may be any one or more of a screw, a rivet, a pin, adhesive, or the like. For example, each of the one or more coupling devices 126A-B may be a screw that extends through an aperture in the circuit board 124 and the mounting surface 122 to threadably couple the circuit board 124 to the mounting platform 114.

The circuit board 124 may be any type of circuit board, such as a printed circuit board (PCB), a strip board, or a bread board. In examples where the circuit board 124 is a PCB, the PCB may be any type of PCB, such as a single layer PCB, a double layer PCB, a multi-layer PCB, a high density interconnect PCB, or a high frequency PCB. The circuit board 124 may have a top surface and an opposing bottom surface. The bottom surface of the circuit board 124 may abut a top surface of the mounting surface 122 and the top surface of the circuit board 124 may face an inner surface of one of the walls 104-110 of the housing 102. For example, the top surface of the circuit board 124 may face an inner surface of the top wall 104. The circuit board 124 may be electrically coupled to a battery in the battery cavity 116 or to another power source.

The circuit board 124 may include any number of components positioned on and electrically coupled to the circuit board 124. For example, an activation switch 128 may be positioned along a surface of the circuit board 124. For example, the activation switch 128 may be positioned along the top surface of the circuit board 124 and may be electrically coupled to the circuit board 124. The activation switch 128 may be positioned below and/or otherwise aligned with the shaft 140 of the activation member 136. The activation member 136 may be configured to operably engage at least a portion of the activation switch 128. For example, a user may apply a manual force on the head member 138 of the activation member 136 in the direction B to move the activation member 136 in the direction B until the free end of the shaft 140 contacts a portion of the activation switch 128 and activates the activation switch 128. For example, the free end of the shaft 140 may depress a button on the activation switch 128. Once the manual force on the head member 138 is removed, the biasing member may move the activation member 136 in the direction A.

One or more sensors 130, 132 may be positioned along a surface of the circuit board 124. For example, the one or more sensors 130, 132 may be positioned along the top surface of the circuit board 124 and may be electrically coupled to the circuit board 124. In another example, the one or more sensors 130, 132 may be mounted in another portion of the cavity 112 of the housing 102 and communicably coupled to the circuit board 124. Each of the one or more sensors 130, 132 may be configured to sense one or more environmental conditions, such as temperature, humidity, occupancy, barometric pressure, magnetic flux, light-level, vibration, and the like. For example, the sensor 130 may be configured to sense ambient temperature and the sensor 132 may be configured to sense ambient humidity. For example, the sensor 130 may be configured to sense ambient temperature and ambient humidity and the sensor 132 may be configured to sense another environmental condition or may be eliminated altogether. The one or more sensors 130, 132, may be positioned adjacent to the activation switch 128 on the circuit board 124. In another example, the one or more sensors 130, 132 may be positioned in another portion of the housing away from the activation switch 128

Figure 1C:
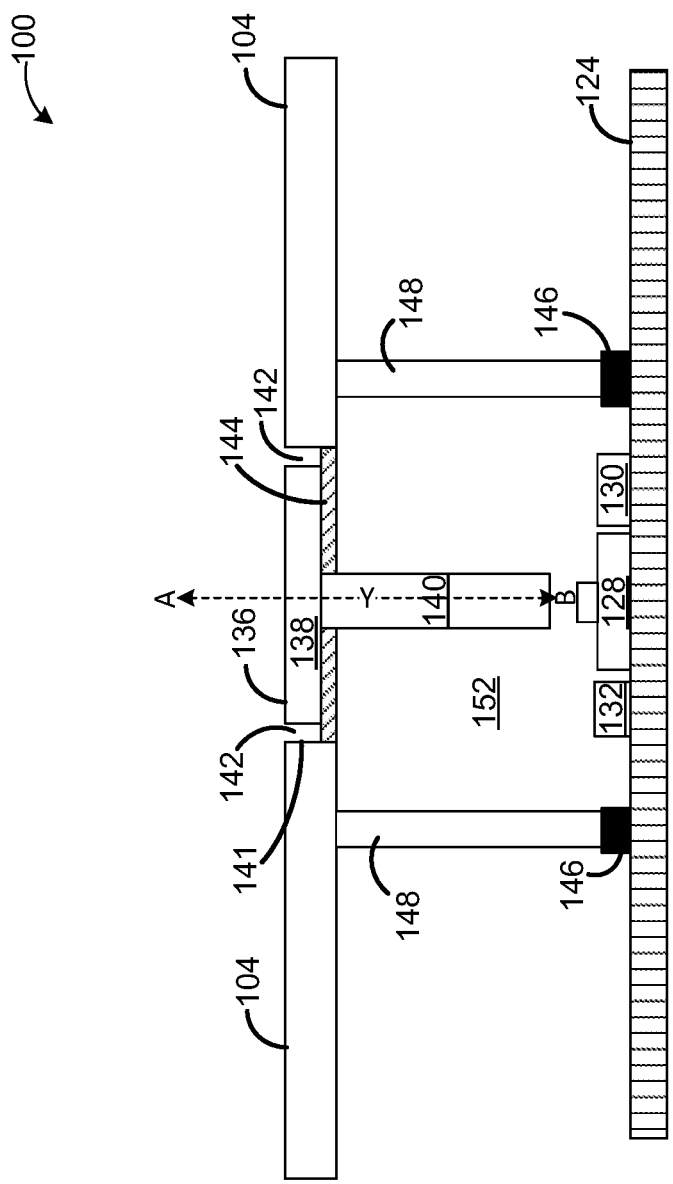
FIG. 1C shows a partial cross-sectional view of the example sensing device.
Figure 1E:
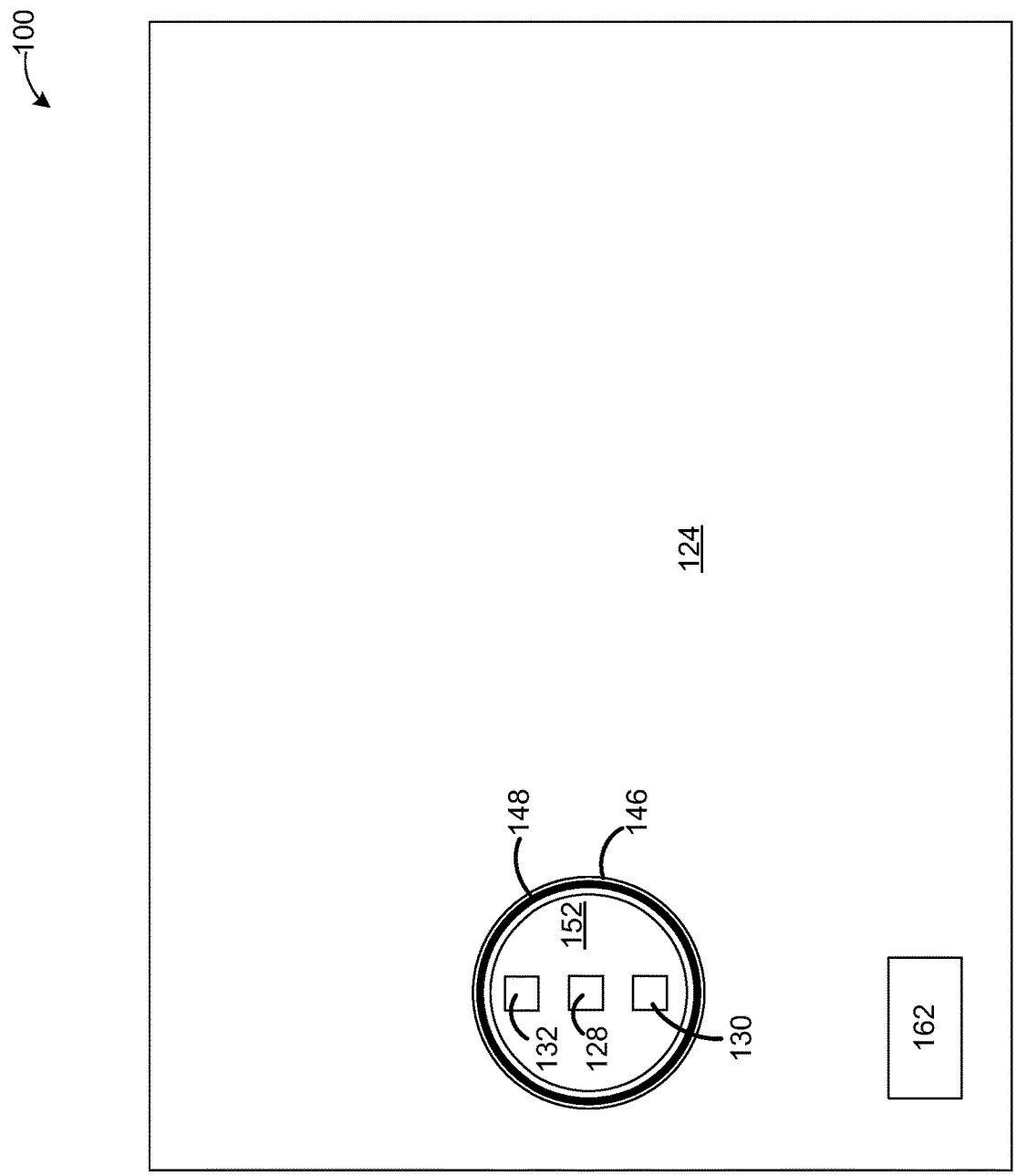
FIG. 1E shows a partial cross-sectional view of the example sensing device.

As best shown in FIG. 1C, the sensing device 100 may include a chamber. The chamber may include one or more chamber side walls 148. The one or more chamber side walls 148 may have a first end coupled to the housing 102. For example, the one or more chamber side walls 148 may have a first end coupled to an inner surface of the wall 104-110 that includes the switch aperture 141. For example, the one or more chamber side walls 148 may have a first end coupled to an inner surface of the top wall 104. For example the first end of the one or more chamber side walls 148 may be positioned adjacent to the switch aperture 141.

The one or more chamber side walls 148 may extend from the inner surface of the top wall 104 towards the circuit board 124. For example, the second end of the one or more chamber side walls 148 may extend to the circuit board 124. For example, the second end of the one or more chamber side walls 148 may contact a top or bottom surface of the circuit board 124. The second end of the one or more chamber side walls 148 may include a gasket 146 for contacting the circuit board. For example, each of the one or more chamber side walls 148 may be constructed of more than one material. For example, a first material may make up the first end of the one or more chamber side walls 148 that extends towards the circuit board 124 and a second material, the gasket 146, that makes up the second end of the one or more chamber side walls 148 and that contacts the circuit board 124. Both the first material and the second material that make up each of the one or more chamber side walls 148 may be a non-conductive material, and may be constructed of the same or different materials (e.g., non-conductive materials such as rubber, synthetic rubber, plastic, ceramic, or silicone). For example, the first material may be plastic and the second material, the gasket 146, may be silicone.

The one or more chamber side walls 148 may be coupled to one another to define any connected 3-dimensional shape, such as a cylinder, an ellipsoid, rectangular cuboid, cube, triangular prism, or any other shape. For example, the sensing device 100 may include one chamber side wall 148 in the shape of a cylinder. The one or more chamber side walls 148 may surround a portion (e.g., less than 50%, less than 30%, less than 20%, less than 10%, less than 5%) of the surface of the circuit board 124 and may seal off the portion of the circuit board from another portion of the circuit board. The one or more chamber side walls 148 may surround the activation switch 128 and the one or more sensors 130, 132. For example, the one or more chamber side walls 148 may define a chamber 152 that seals a portion of the circuit board 124 (e.g., less than 50%, less than 30%, less than 20%, less than 10%, less than 5%) from a remaining portion of the circuit board 124 and extends from the circuit board to the inner surface of the top wall 104. For example, the chamber 152 may include one or more of the activation switch 128 and the one or more sensors 130, 132. For example, the portion of the circuit board 124 within the chamber 152 may be smaller than the portion of the circuit board 124 outside of the chamber 152. For example, the portion of the circuit board 124 within the chamber 152 may be anywhere between about 1 percent to about 40 percent of the surface area of the top surface of the circuit board 124. The chamber 152 may be generally aligned with the activation member 136 such that the shaft 140 extends into the chamber 152 and the air gaps 142 are in fluid communication with the chamber 152. The chamber 152 may be sealed off from the remaining portion of the housing 102 by the one or more chamber side walls 148 and the portion of the circuit board 124 within the chamber 152. For example, the seal may be air tight and/or water tight.

While not shown, in another example, the one or more chamber side walls 148 may extend from the inner surface of the top wall 104 towards a secondary bottom wall. For example, the second end of the one or more chamber side walls 148 may extend to the secondary bottom wall to create a secondary chamber within the cavity 112. For example, the second end of the one or more chamber side walls 148 may contact, be coupled to or integrally formed with the secondary bottom wall. In this example, the one or more chamber side walls 148 may be coupled to one another to define any connected 3-dimensional shape, such as a cylinder, an ellipsoid, rectangular cuboid, cube, triangular prism, or any other shape. For example, the sensing device 100 may include one chamber side wall 148 in the shape of a cylinder. The one or more chamber side walls 148 may surround the activation switch 128 and the one or more sensors 130, 132. The one or more sensors 130, 132 may be mounted anywhere within the housing and communicably coupled to the circuit board 124. For example, the secondary chamber may include one or more of the activation switch 128 and the one or more sensors 130, 132. The secondary chamber may be generally aligned with the activation member 136 such that the shaft 140 extends into the secondary chamber and the air gaps 142 are in fluid communication with the secondary chamber. The secondary chamber may be sealed off from the remaining portion of the housing 102 by the one or more chamber side walls 148 and the secondary bottom wall. For example, the seal may be air tight and/or water tight.

The air gap 142 may be sufficient to allow air to flow between the outer perimeter of the head member 138 and the perimeter of the switch aperture 141 from an area outside of the housing 102 and into the chamber 152. The air gap 142 may not be in fluid communication with portions of the cavity 112 of the housing 102 outside of the chamber 152. The air, flowing into the chamber 152 through the air gap 142, may come into contact with the one or more sensors 130, 132. The air flowing through the air gap 142 may be trapped in the chamber 152 and may not disperse into other portions of the cavity 112 in the housing 102. The chamber 152, having a substantially smaller volume than the entire cavity 112 of the housing 102, may be able to more quickly equate to certain environmental conditions outside of the housing 102, such as temperature, humidity, and light level, such that the one or more sensors 130, 132 may provide more accurate readings of the environmental conditions outside of the housing 102.

The sensing device 100 may include a membrane or gasket 144. The membrane/gasket 144 may be positioned along or adjacent the switch aperture 141. The membrane/gasket 144 may be positioned along an exterior surface of the housing 102 (e.g., along the exterior surface of the top wall 104) and coupled to the exterior surface of the housing and/or the activation member 136 to cover the one or more air gaps 142. The membrane gasket 144 may be sandwiched between two pieces of the head member 138 and extend therefrom to cover the one or more air gaps 142. For example the membrane/gasket 144 may extend from the head member 138 to the perimeter of the switch aperture 141. The membrane/gasket 144 may be configured to allow air and/or water vapor to pass through the membrane/gasket 144 via the air gap 142 and into the chamber 152. The membrane/gasket 144 may be configured to prevent liquid water from passing through the membrane/gasket 144. The membrane/gasket 144 may be constructed of any porous material. The membrane/gasket 144 may be constructed of a porous material that may repel liquid water while allowing air and water vapor to pass through the membrane/gasket 144 and into the chamber 152. For example, the membrane/gasket 144 may be constructed of stretched polytetrafluoroethylene (PTFE), expanded PTFE (ePTFE) Gore-Tex, Teflon or neoprene.

The sensing device 100 may include a transmitter or transceiver 162. The transmitter or transceiver 162 may be positioned along a surface of the circuit board 124. For example, the transmitter or transceiver 162 may be positioned along the top surface of the circuit board 124 outside of the chamber 152 and may be electrically coupled to the circuit board 124. The transmitter or transceiver 162 may be communicably coupled to the one or more sensors 130, 132. The transmitter or transceiver may be configured to transmit environmental data received from the one or more sensors 130, 132 to a wireless device or another computer.

FIGS. 2A-E show various views of an example sensing device 200 that may be configured to sense environmental condition data, such as temperature data, humidity data, occupancy data, barometric pressure data, magnetic flux data, light-level data, vibration data, etc., and send that data to a user device and/or a computing device. The sensing device 200 may be one or more of a temperature sensor, a humidity sensor, an occupancy sensor, a photosensor, a barometric pressure sensor, a magnetic flux sensor, a vibration sensor, or any other type of sensor. The sensing device 200 may be configured to be mounted, either fixedly or removably, to a portion of a building, such as a wall, ceiling, or floor, either directly or indirectly with the use of additional components.

The sensing device 200 may include a housing 102. The housing 102 may be constructed of one or more pieces. For example multiple pieces of the housing 102 may be coupled together using coupling devices, such as screws, nails, rivets, adhesive, pins and apertures, or the like. The housing 102 may be made of metal, plastic, wood, or any combination thereof. The housing 102 may have any 3-dimensional shape. For example, the housing 102 may be generally shaped as any one or more of a rectangular cuboid, cube, sphere, cylinder, triangular prism, or the like.

The housing 102 may include one or more walls depending on the shape of the housing 102 and the desired function of the device 200. For example, the housing 102 may include a top wall 104. The top wall 104 may include an outer facing surface and an inner facing surface. The top wall 104 may have any shape and surface. For example, the shape of the top wall 104 may be rectangular, oval, circular, triangular or any other geometric or non-geometric shape. For example, the outer surface of the top wall 104 may be planar, curved, and/or may include surface texturing.

The housing 102 may also include a bottom wall 106. The bottom wall 106 may include an outer facing surface and an inner facing surface. The bottom wall 106 may have any shape and surface. For example, the shape of the bottom wall 106 may be rectangular, oval, circular, triangular or any other geometric or non-geometric shape. For example, the outer surface of the bottom wall 106 may be planar, curved, and/or may include surface texturing.

The housing 102 may also include one or more side walls. The one or more side walls may extend from the bottom wall 106 to the top wall 104 or from the bottom 106 or top 104 wall to an intermediate wall. For example, the housing 102 may include a first side wall 107 that may have a first end coupled to the bottom wall 106 and a distal second end coupled to the top wall 104. The first side wall 107 may be positioned along a first side of the housing 102. The first side wall 107 may have any shape and surface. For example, the shape of the first side wall 107 may be rectangular, oval, circular, triangular or any other geometric or non-geometric shape. For example, the outer surface of the first side wall 107 may be planar, curved, and/or may include surface texturing.

The housing 102 may include a second side wall 108 that may have a first end coupled to the bottom wall 106 and a distal second end coupled to the top wall 104. The second side wall 108 may be positioned along a second side of the housing 102. The second side wall 108 may have any shape and surface. For example, the shape of the second side wall 108 may be rectangular, oval, circular, triangular or any other geometric or non-geometric shape. For example, the outer surface of the second side wall 108 may be planar, curved, and/or may include surface texturing.

The housing 102 may include a third side wall 109 that may have a first end coupled to the bottom wall 106 and a distal second end coupled to the top wall 104. The third side wall 109 may be positioned along a third side of the housing 102. The third side wall 109 may have any shape and surface. For example, the shape of the third side wall 109 may be rectangular, oval, circular, triangular or any other geometric or non-geometric shape. For example, the outer surface of the third side wall 109 may be planar, curved, and/or may include surface texturing.

The housing 102 may include a fourth side wall 110 that may have a first end coupled to the bottom wall 106 and a distal second end coupled to the top wall 104. The fourth side wall 110 may be positioned along a fourth side of the housing 102. The fourth side wall 110 may have any shape and surface. For example, the shape of the fourth side wall 110 may be rectangular, oval, circular, triangular or any other geometric or non-geometric shape. For example, the outer surface of the fourth side wall 110 may be planar, curved, and/or may include surface texturing.

The first side wall 107 may extend from the fourth side wall 110 to the second side wall 108. The second side wall 108 may extend from the first side wall 107 to the third side wall 109. The third side wall 109 may extend from the second side wall 108 to the fourth side wall 110. The fourth side wall 110 may extend from the third side wall 109 to the first side wall 107. The one or more top walls 104, bottom walls 106 and side walls 107-110 may define a cavity 112 within the housing 102. The cavity 112 may be an open space within the housing 102 that is configured to receive one or more components of the sensing device 200.

The sensing device 200 may include an activation member 202. The activation member 202 may be a manually adjustable device for turning on, turning off, or changing an operational status of the sensing device 200. For example, a user may apply a force to the activation member 202 to cause the sensing device 200 to be turned on, turn off, or to change an operational status of the sensing device 200. The activation member 202 may be any one or more of a push-button switch, a rotary switch, a rocker switch, a slide switch, a toggle switch, a hall-effect sensor or reed switch with a magnet (not shown) on the opposing end of the shaft 208, or any other type of switch known to those of ordinary skill in the art. For example, the activation member 202 may be a push-button switch.

The activation member 202, as a push-button switch, may include a head member 204 and a shaft 208 that has a first end coupled to the head member 204 and a distal free end that extends from one side of the head member 204. The activation member 202 may be movable along the longitudinal axis Y with respect to the housing 102. The activation member 202 may also include a biasing member (not shown), such as a spring, that biases the activation member 202 in the direction A. The activation member 202 may be operably coupled to the housing 102, the mounting platform 114 and/or the circuit board 124.

The activation member 202 may extend through an aperture in one of the walls 104-110 of the housing 102 and into the cavity 112 of the housing 102. For example, the top wall 104, bottom wall 106, first side wall 107, second side wall 108, third side wall 109, or fourth side wall 110 may include a switch aperture 141. For example, the top wall 104 may include the switch aperture 141. The switch aperture 141 may have any shape, such as round, rectangular, triangular, oval, or any other geometric and non-geometric shape. The switch aperture 141 may have a perimeter having a perimeter distance that defines the opening through the top wall 104. The head member 204 of the activation member 202 may have any shape, such as round, rectangular, triangular, oval, or any other geometric or non-geometric shape. For example, the head member 204 can have a shape that corresponds with the shape of the switch aperture 141. For example, both the switch aperture 141 and the head member 204 may be circular, may be rectangular, may be triangular, may be oval, or may be any other corresponding shape.

The head member 204 may have an outer perimeter with a perimeter distance that is equal to or slightly less than the perimeter distance of the switch aperture 141. For example, the head member 204 may be capable of being inserted into and through the switch aperture 141 with little to no space between the outer perimeter of the head member 204 and the perimeter of the switch aperture 141. For example, in a resting position, the top surface of the head member 204 may be level or substantially level with the outer surface of the top wall 104. For example, in a resting position, the top surface of the head member 204 may extend above or be recessed below the outer surface of the top wall 104. The head member 204 may include one or more apertures 206A-F that extend through head member 204 to provide one or more air pathways through the head member 204.

While FIGS. 2A-D show six apertures 206A-F extending through the head member 204 this is for example purposes only as the number of apertures 206A-F that extend through the head member 204 may be one or more. Each aperture 206A-F may have the same diameter or one or more of the apertures 206A-F may have a different diameter. The one or more apertures 206A-F may be positioned along the head member 204 in any manner. For example, the one or more apertures 206A-F may be equally-spaced along the surface of the head member 204. Each of the one or more air pathways may be configured to allow ambient air from outside of the housing 102 to flow through the one or more air pathways and into the chamber 152.

Figure 2A:
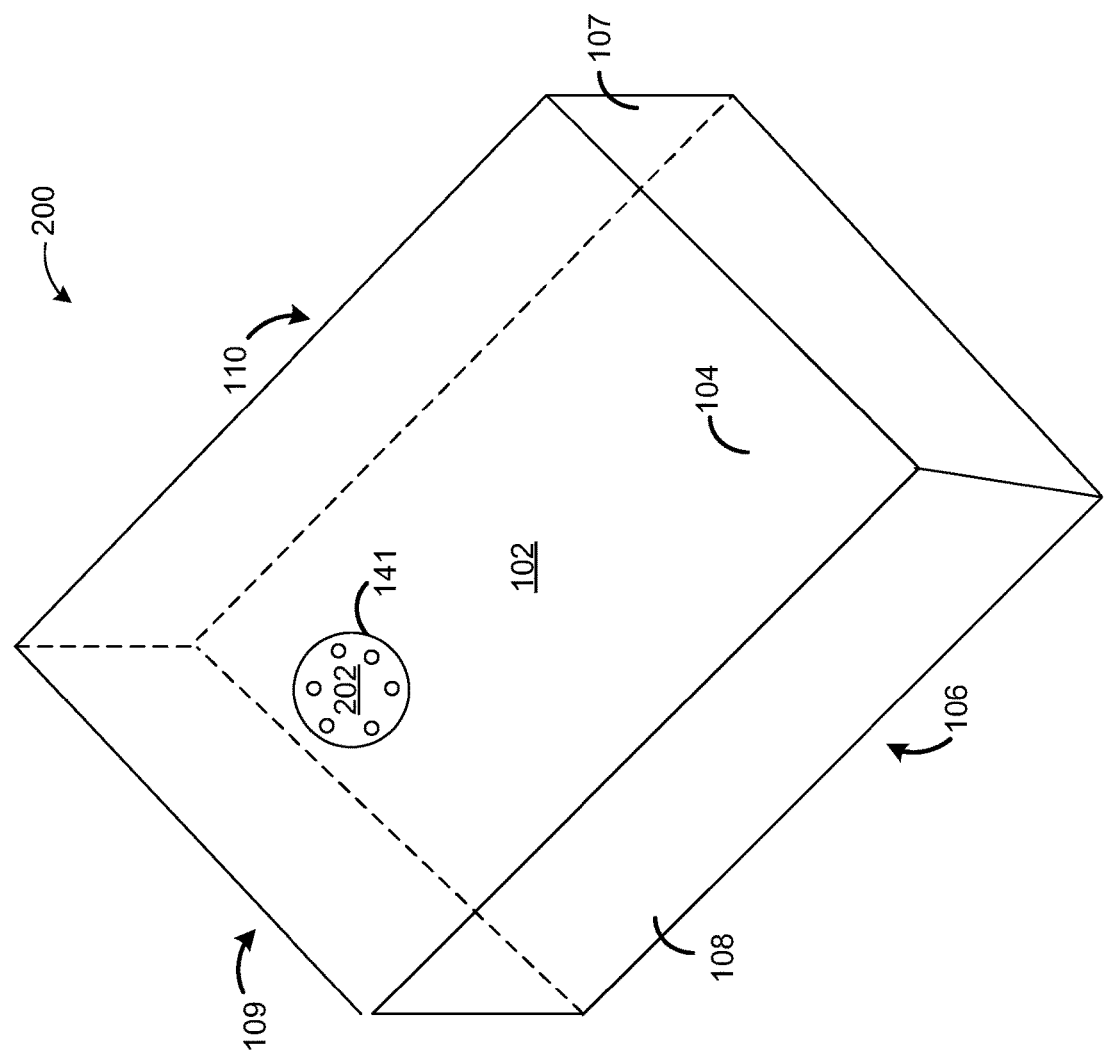
FIG. 2A shows a perspective view of another example sensing device.
Figure 2B:
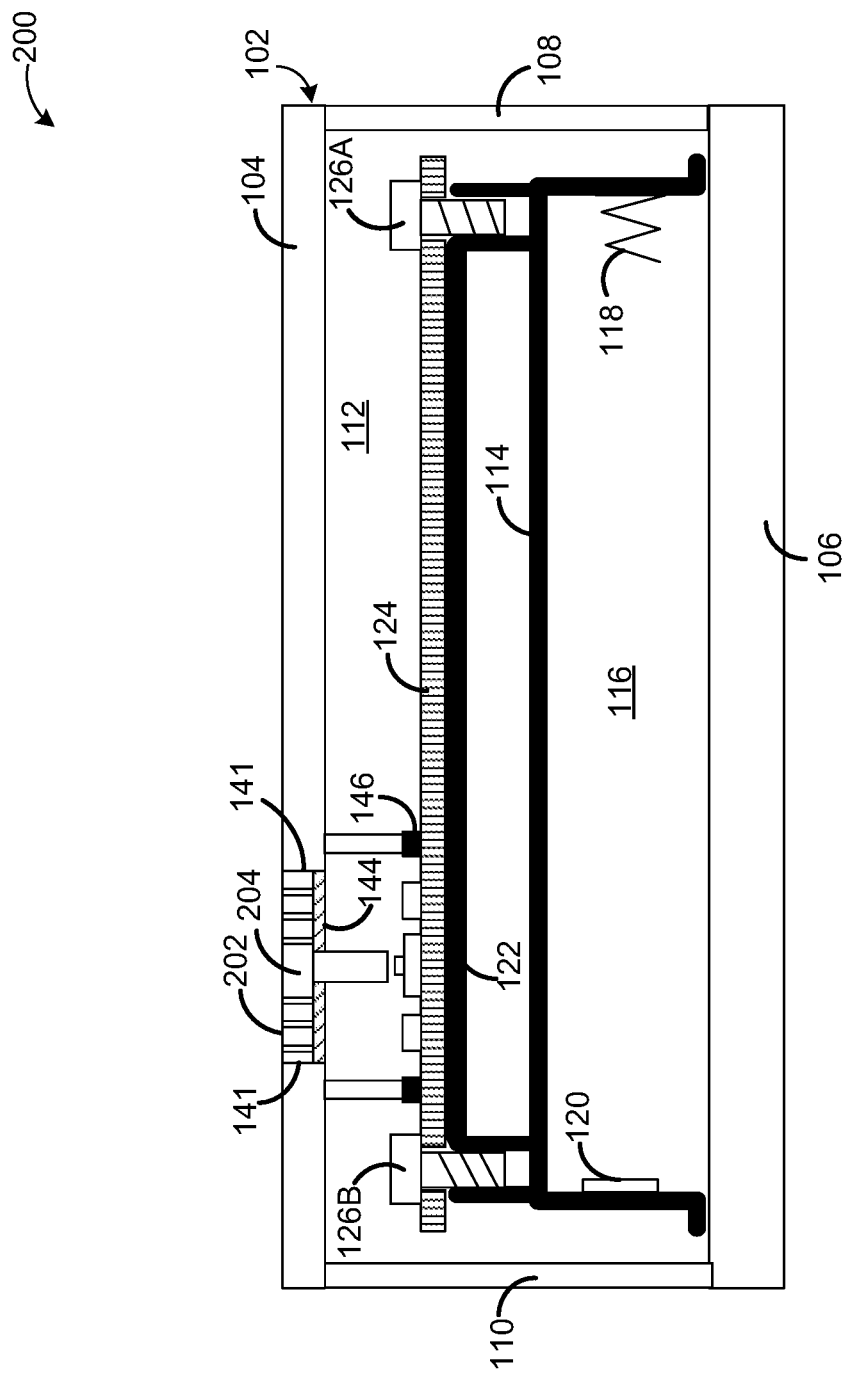
FIG. 2B shows a cross-section view of the other example sensing device.

As best shown in FIG. 2B, the sensing device 200 may include a mounting platform 114. For example, the mounting platform 114 may be a battery tray. The mounting platform 114 may be positioned within the cavity 112 of the housing 102. For example, the mounting platform 114 may be coupled to one or more of the walls 104-110 of the housing 102 via one or more coupling devices, such as screws, rivets, pins, nails, adhesive, or the like. The mounting platform 114 may include one or more vertical or substantially vertical side walls and one or more horizontal or substantially horizontal mounting walls for receiving one or more components. For example, the mounting platform 114 may include one or more side walls and at least one mounting wall that may define a battery cavity 116. The battery cavity 116 may be sized and shaped to receive and removably couple a battery (not shown) to the mounting platform 114. For example, the battery cavity 116 may include a battery contact 118 along a first end of the battery cavity 116 and a battery contact 120 along a distal second end of the battery cavity 116. For example, the battery contact 118 may be a spring contact and the battery contact 120 may be a tab contact. In other examples, the spring contact and the tab contact may be reversed. The battery contact 118 may be configured to abut a first end of a battery and the battery contact 120 may be configured to abut a distal second end of a battery. The battery may be configured to provide electrical power to a circuit board 124 positioned within the cavity 112 of the housing 102. For example, the battery may be removably inserted into the battery cavity 116 and may be electrically coupled to the circuit board 124 via the contacts 118, 120, or the battery may be hard wired and/or soldered to and electrically coupled to the circuit board 124 to provide electrical power to the circuit board 124. The battery can be any type of battery, such as an alkaline battery, a lithium ion battery, a nickel cadmium battery, a button cell battery, or the like.

The sensing device 200 may include a circuit board 124. The circuit board 124 may be positioned within the cavity 112 of the housing 102. The circuit board 124 may be coupled to the mounting platform 114 and/or the housing 102. For example, the circuit board 124 may be coupled to a mounting surface 122 of the mounting platform 114. For example, one or more coupling devices 126A-B may be used to couple the circuit board 124 to the mounting surface 122. The one or more coupling devices 126A-B may be any one or more of a screw, a rivet, a pin, adhesive, or the like. For example, each of the one or more coupling devices 126A-B may be a screw that extends through an aperture in the circuit board 124 and the mounting surface 122 to threadably couple the circuit board 124 to the mounting platform 114.

The circuit board 124 may be any type of circuit board, such as a printed circuit board (PCB), a strip board, or a bread board. In examples where the circuit board 124 is a PCB, the PCB may be any type of PCB, such as a single layer PCB, a double layer PCB, a multi-layer PCB, a high density interconnect PCB, or a high frequency PCB. The circuit board 124 may have a top surface and an opposing bottom surface. The bottom surface of the circuit board 124 may abut a top surface of the mounting surface 122 and the top surface of the circuit board 124 may face an inner surface of one of the walls 104-110 of the housing 102. For example, the top surface of the circuit board 124 may face an inner surface of the top wall 104. The circuit board 124 may be electrically coupled to a battery in the battery cavity 116 or to another power source.

The circuit board 124 may include any number of components positioned on and electrically coupled to the circuit board 124. For example, an activation switch 128 may be positioned along a surface of the circuit board 124. For example, the activation switch 128 may be positioned along the top surface of the circuit board 124 and may be electrically coupled to the circuit board 124. The activation switch 128 may be positioned below and/or otherwise aligned with the shaft 208 of the activation member 202. The activation member 202 may be configured to operably engage at least a portion of the activation switch 128. For example, a user may apply a manual force on the head member 204 of the activation member 202 in the direction B to move the activation member 202 in the direction B until the free end of the shaft 208 contacts a portion of the activation switch 128 and activates the activation switch 128. For example, the free end of the shaft 208 may depress a button on the activation switch 128. Once the manual force on the head member 204 is removed, the biasing member may move the activation member 202 in the direction A.

One or more sensors 130, 132 may be positioned along a surface of the circuit board 124. For example, the one or more sensors 130, 132 may be positioned along the top surface of the circuit board 124 and may be electrically coupled to the circuit board 124. In another example, the one or more sensors 130, 132 may be mounted in another portion of the cavity 112 of the housing 102 and communicably coupled to the circuit board 124. Each of the one or more sensors 130, 132 may be configured to sense one or more environmental conditions, such as temperature, humidity, occupancy, barometric pressure, magnetic flux, light-level, vibration, and the like. For example, the sensor 130 may be configured to sense ambient temperature and the sensor 132 may be configured to sense ambient humidity. For example, the sensor 130 may be configured to sense ambient temperature and ambient humidity and the sensor 132 may be configured to sense another environmental condition or may be eliminated altogether. The one or more sensors 130, 132, may be positioned adjacent to the activation switch 128 on the circuit board 124. In another example, the one or more sensors 130, 132 may be positioned in another portion of the housing away from the activation switch 128

Figure 2C:
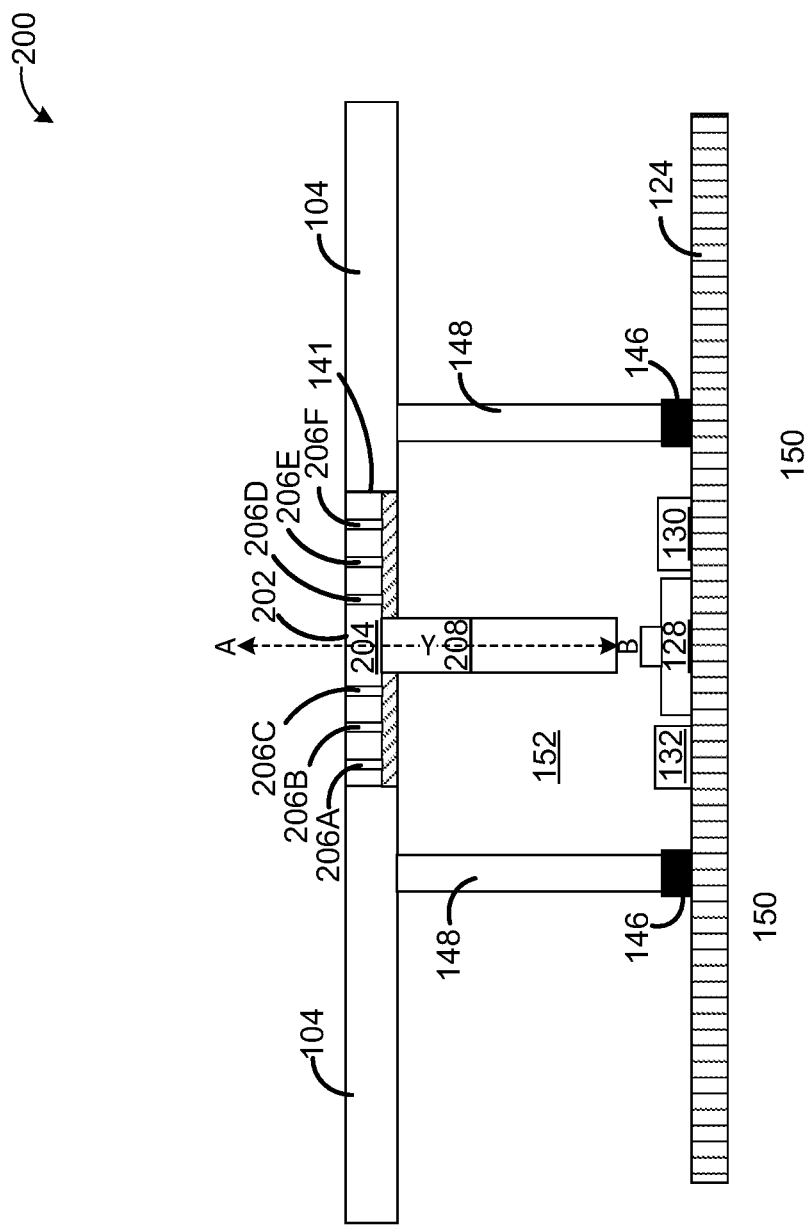
FIG. 2C shows a partial cross-sectional view of the other example sensing device.
Figure 2E:
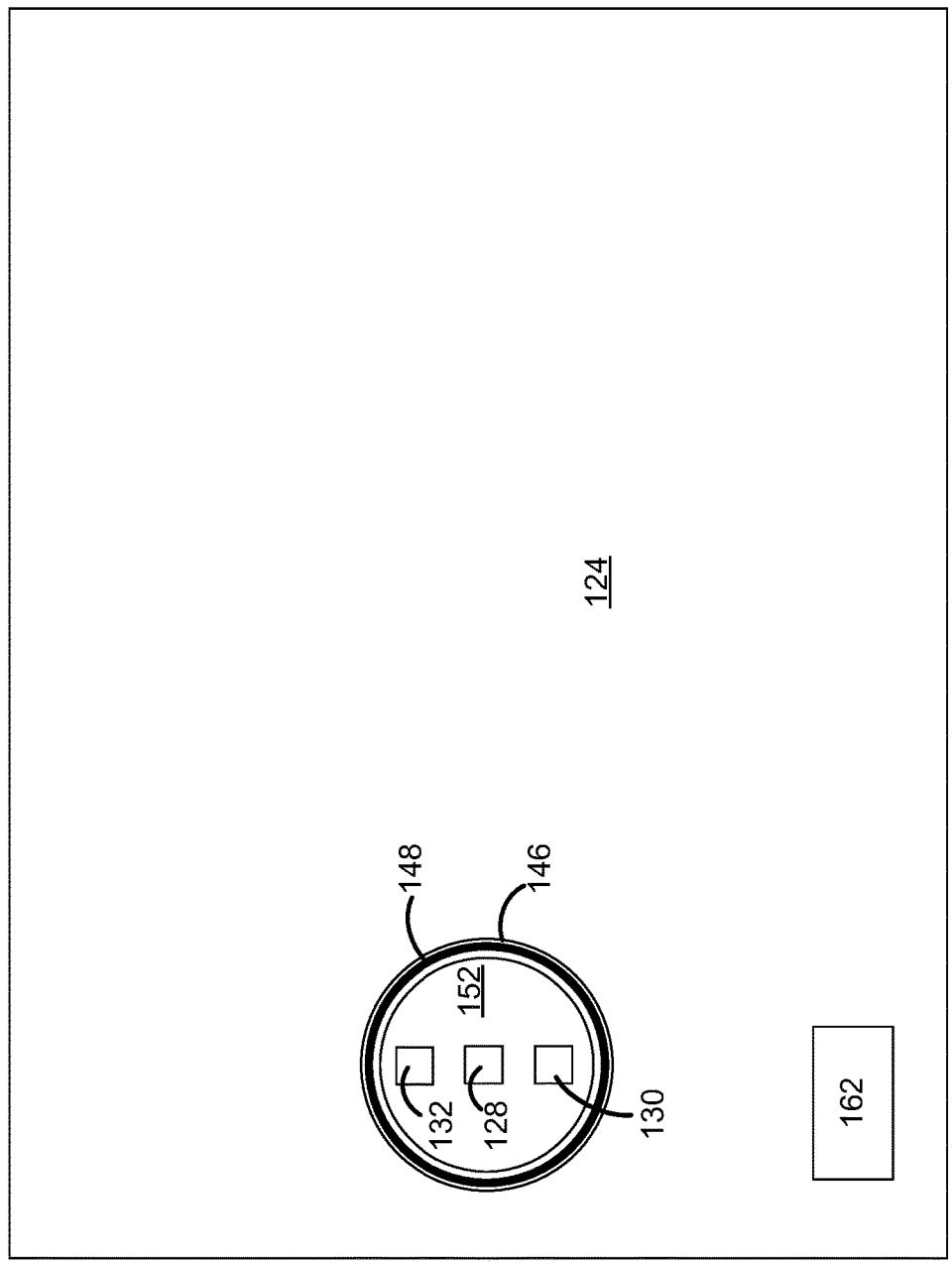
FIG. 2E shows a partial cross-sectional view of the example sensing device.

As best shown in FIG. 2C, the sensing device 200 may include one or more chamber side walls 148. The one or more chamber side walls 148 may have a first end coupled to the housing 102. For example, the one or more chamber side walls 148 may have a first end coupled to an inner surface of the wall 104-110 that includes the switch aperture 141. For example, the one or more chamber side walls 148 may have a first end coupled to an inner surface of the top wall 104. For example the first end of the one or more chamber side walls 148 may be positioned adjacent to the switch aperture 141.

The one or more chamber side walls 148 may extend from the inner surface of the top wall 104 towards the circuit board 124. For example, the second end of the one or more chamber side walls 148 may extend to the circuit board 124. For example, the second end of the one or more chamber side walls 148 may contact the top or bottom surface of the circuit board 124. The second end of the one or more chamber side walls 148 may include a gasket 146 for contacting the surface of the circuit board. For example, each of the one or more chamber side walls 148 may be constructed of more than one material. For example, a first material may make up the first end of the one or more chamber side walls 148 that extends towards the circuit board 124 and a second material, the gasket 146, that makes up the second end of the one or more chamber side walls 148 and that contacts the circuit board 124. Both the first material and the second material that make up each of the one or more chamber side walls 148 may be a non-conductive material, and may be constructed of the same or different materials (e.g., non-conductive materials such as rubber, synthetic rubber, plastic, ceramic, or silicone). For example, the first material may be plastic and the second material, the gasket 146, may be silicone.

The one or more chamber side walls 148 may be coupled to one another to define any connected 3-dimensional shape, such as a cylinder, an ellipsoid, rectangular cuboid, cube, triangular prism, or any other shape. For example, the sensing device 200 may include one chamber side wall 148 in the shape of a cylinder. The one or more chamber side walls 148 may surround a portion (e.g., less than 50%, less than 30%, less than 20%, less than 10%, less than 5%) of the surface of the circuit board 124. The one or more chamber side walls 148 may surround the activation switch 128 and the one or more sensors 130, 132. For example, the one or more chamber side walls 148 may define a chamber 152 that seals a portion of the circuit board 124 (e.g., less than 50%, less than 30%, less than 20%, less than 10%, less than 5%) from a remaining portion of the circuit board 124 and extends from the circuit board to the inner surface of the top wall 104. For example, the chamber 152 may include one or more of the activation switch 128 and the one or more sensors 130, 132. For example, the portion of the circuit board 124 within the chamber 152 may be smaller than the portion of the circuit board 124 outside of the chamber 152. For example, the portion of the circuit board 124 within the chamber 152 may be anywhere between 1-40 percent of the surface area of the top surface of the circuit board 124. The chamber 152 may be generally aligned with the activation member 202 such that the shaft 208 extends into the chamber 152 and a fluid communication channel is defined from an exterior of the housing 102, through the one or more air pathways 206A-F in the head member 204 and into the chamber 152 to the portion of the circuit board and/or the one or more sensors 130, 132. The chamber 152 may be sealed off from the remaining portion of the housing 102 by the one or more chamber side walls 148 and the portion of the circuit board 124 within the chamber 152. For example, the seal may be air tight and/or water tight.

While not shown, in another example, the one or more chamber side walls 148 may extend from the inner surface of the top wall 104 towards a secondary bottom wall. For example, the second end of the one or more chamber side walls 148 may extend to the secondary bottom wall to create a secondary chamber within the cavity 112. For example, the second end of the one or more chamber side walls 148 may contact, be coupled to or integrally formed with the secondary bottom wall. In this example, the one or more chamber side walls 148 may be coupled to one another to define any connected 3-dimensional shape, such as a cylinder, an ellipsoid, rectangular cuboid, cube, triangular prism, or any other shape. For example, the sensing device 100 may include one chamber side wall 148 in the shape of a cylinder. The one or more chamber side walls 148 may surround the activation switch 128 and the one or more sensors 130, 132. The one or more sensors 130, 132 may be mounted anywhere within the housing and communicably coupled to the circuit board 124. For example, the secondary chamber may include one or more of the activation switch 128 and the one or more sensors 130, 132. The secondary chamber may be generally aligned with the activation member 202 such that the shaft 208 extends into the secondary chamber and the one or more air pathways 206A-F defining a fluid communication channel in fluid communication with the secondary chamber. The secondary chamber may be sealed off from the remaining portion of the housing 102 by the one or more chamber side walls 148 and the secondary bottom wall and may seal off a portion of the circuit board from another portion of the circuit board. For example, the seal may be air tight and/or water tight.

The one or more air pathways 206A-F through the head member 204 may be sufficiently sized to allow air to flow through the one or more air pathways 206A-F along a fluid communication channel from an area outside of the housing 102 and into the chamber 152 to and/or towards the portion of the circuit board and/or one or more sensors 130, 132. The one or more air pathways 206A-F through the head member 204 may not be in fluid communication with or define fluid communication channels to portions of the cavity 112 of the housing 102 outside of the chamber 152. The air, flowing into the chamber 152 through the one or more air pathways 206A-F through the head member 204, may come into contact with the one or more sensors 130, 132. The air flowing through the one or more air pathways 206A-F through the head member 204 may be trapped in the chamber 152 and may not disperse into other portions of the cavity 112 in the housing 102. The chamber 152, having a substantially smaller volume than the entire cavity 112 of the housing 102, may be able to more quickly equate to certain environmental conditions outside of the housing 102, such as temperature, humidity, and light level, such that the one or more sensors 130, 132 may provide more accurate readings of the environmental conditions outside of the housing 102.

The sensing device 200 may include a membrane or gasket 144. The membrane/gasket 144 may be positioned along or adjacent the switch aperture 141. For example the membrane/gasket 144 may extend along a bottom surface of the head member 204 to cover the one or more air pathways 206A-F through the head member 204 and extend to the perimeter of the switch aperture 141. The membrane/gasket 144 may be positioned along an exterior surface of the housing 102 (e.g., along the exterior surface of the top wall 104) and coupled to the exterior surface of the housing and/or the activation member 202 to cover the one or more air pathways 206A-F. The membrane gasket 144 may be sandwiched between two pieces of the head member 204 and extend therefrom to cover the one or more air pathways 206A-F. The membrane/gasket 144 may be configured to allow air and/or water vapor to pass through the membrane/gasket 144 via the one or more air pathways 206A-F through the head member 204 and into the chamber 152. The membrane/gasket 144 may be configured to prevent liquid water from passing through the membrane/gasket 144. The membrane/gasket 144 may be constructed of any porous material. The membrane/gasket 144 may be constructed of a porous material that may repel liquid water while allowing air and water vapor to pass through the membrane/gasket 144 and into the chamber 152. For example, the membrane/gasket 144 may be constructed of stretched polytetrafluoroethylene (PTFE), expanded PTFE (ePTFE), Gore-Tex, Teflon or neoprene.

The sensing device 200 may include a transmitter or transceiver 162. The transmitter or transceiver 162 may be positioned along a surface of the circuit board 124. For example, the transmitter or transceiver 162 may be positioned along the top surface of the circuit board 124 outside of the chamber 152 and may be electrically coupled to the circuit board 124. The transmitter or transceiver 162 may be communicably coupled to the one or more sensors 130, 132. The transmitter or transceiver may be configured to transmit environmental data received from the one or more sensors 130, 132 to a wireless device or another computer.

While specific configurations have been described, it is not intended that the scope be limited to the particular configurations set forth, as the configurations herein are intended in all respects to be possible configurations rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of configurations described in the specification.

It will be apparent to those skilled in the art that various modifications and variations may be made without departing from the scope or spirit. Other configurations will be apparent to those skilled in the art from consideration of the specification and practice described herein. It is intended that the specification and described configurations be considered as exemplary only, with a true scope and spirit being indicated by the following claims.

What is claimed is:

1. An apparatus comprising:
    a housing comprising an aperture through an outer surface of the housing;
    an activation member positioned in the aperture along the outer surface of the housing;
    a gasket positioned adjacent the activation member;
    a circuit board positioned within the housing;
    a chamber wall in contact with and disposed about a portion of the circuit board, wherein the chamber wall defines a chamber that seals the portion of the circuit board from a remaining portion of the circuit board; and
    a pathway that defines a fluid communication channel between the portion of the circuit board and an exterior of the housing,
    wherein a spacing between an outer perimeter of the activation member and the outer surface of the housing defines an air gap, the air gap defining a portion of the fluid communication channel between the portion of the circuit board and the exterior of the housing and wherein the gasket covers at least a portion of the air gap.

2. The apparatus of claim 1, further comprising a sensor positioned in the chamber, wherein the sensor is operably coupled to the circuit board.

3. The apparatus of claim 2, wherein the sensor is an environmental sensor.

4. The apparatus of claim 1, further comprising an activation switch positioned in the chamber and operably coupled to the circuit board, wherein the activation member is configured to engage the activation switch.

5. The apparatus of claim 1, wherein the activation member further comprises a plurality of apertures extending through a portion of the activation member, wherein the plurality of apertures define another portion of the fluid communication channel.

6. The apparatus of claim 1, wherein the chamber wall extends from the circuit board to the housing.

7. The apparatus of claim 1, wherein at least a portion of the chamber wall is constructed of a flexible material.

8. The apparatus of claim 1, further comprising a battery tray positioned within the housing, wherein the circuit board is coupled to the battery tray.

9. The apparatus of claim 1, wherein the activation member comprises:
    a head member disposed in the aperture along the outer surface of the housing; and
    a shaft member extending from the head member into the chamber, wherein a portion of the shaft member is configured to contact an activation switch positioned within the chamber.

10. An apparatus comprising:
    a housing comprising a plurality of walls defining a cavity and an aperture through an outer surface of the housing;
    an activation member disposed in the aperture along the outer surface of the housing;
    a gasket positioned adjacent the activation member;
    a circuit board positioned within the cavity;
    a sensor coupled to and disposed on the circuit board;
    a chamber comprising at least one chamber wall in contact with a portion of the circuit board, wherein the at least one chamber wall seals the chamber and the portion of the circuit board from a remaining portion of the circuit board and wherein the sensor is positioned on the portion of the circuit board within the chamber;
    a pathway in fluid communication with the portion of the circuit board and an exterior of the housing; and
    wherein a spacing between an outer perimeter of the activation member and the outer surface of the housing defines an air gap, the air gap defining a first end of the pathway in fluid communication with the portion of the circuit board and the exterior of the housing and wherein the gasket covers at least a portion of the air gap.

11. The apparatus of claim 10, wherein the activation member comprises:
    a head member comprising a plurality of apertures; and
    a shaft member extending from the head member into the cavity,
    wherein the plurality of apertures further define the first end of the pathway.

12. The apparatus of claim 10, wherein the sensor is an environmental sensor.

13. The apparatus of claim 10, wherein the at least one chamber wall extends from the circuit board to the housing.

14. The apparatus of claim 10, wherein the activation member comprises:
    a head member disposed in the aperture along the outer surface of the housing; and a shaft member extending from the head member into the cavity, wherein a portion of the shaft member is configured to contact an activation switch positioned within the chamber.

15. An apparatus comprising:

a housing comprising an aperture through an outer surface of the housing;

an activation member positioned in the aperture along the outer surface and comprising a plurality of apertures extending through a portion of the activation member;

a gasket positioned adjacent to the activation member and covering at least a portion of the plurality of apertures;

a circuit board positioned within the housing;

at least one chamber side wall abutting the circuit board and defining a chamber that seals a portion of the circuit board from a remaining portion of the circuit board;

a pathway defining a fluid communication channel between the portion of the circuit board and an exterior of the housing, wherein a first end of the pathway is defined by the plurality of apertures in the activation member.

16. The apparatus of claim 15, further comprising:

a sensor positioned within the chamber along the portion of the circuit board; and an activation switch positioned within the chamber, wherein the activation member is configured to engage the activation switch.

17. The apparatus of claim 15, wherein the at least one chamber side wall extends from the circuit board to the housing.

18. The apparatus of claim 15, wherein the activation member comprises:

a head member comprising the plurality of apertures; and a shaft member extending from the head member into the chamber.

19. The apparatus of claim 15, wherein a spacing between an outer perimeter of the activation member and the outer surface of the housing defines an air gap, the air gap further defining the first end of the pathway defining the fluid communication channel between the portion of the circuit board and the exterior of the housing.

20. The apparatus of claim 15, wherein the activation member comprises:

a head member disposed in the aperture along the outer surface of the housing; and a shaft member extending from the head member into the chamber, wherein a portion of the shaft member is configured to contact an activation switch positioned within the chamber.

\* \* \* \* \*